United States Patent
Sano

(10) Patent No.: US 10,571,946 B2
(45) Date of Patent: Feb. 25, 2020

(54) CONSTANT VOLTAGE OUTPUT CIRCUIT

(71) Applicant: ABLIC Inc., Chiba-shi, Chiba (JP)

(72) Inventor: Minoru Sano, Chiba (JP)

(73) Assignee: ABLIC INC., Chiba (JP)

( * ) Notice: Subject to any disclaimer, the term of this patent is extended or adjusted under 35 U.S.C. 154(b) by 17 days.

(21) Appl. No.: 15/928,454

(22) Filed: Mar. 22, 2018

(65) Prior Publication Data

US 2018/0275705 A1   Sep. 27, 2018

(30) Foreign Application Priority Data

Mar. 24, 2017   (JP) ................. 2017-059974

(51) Int. Cl.
| | |
|---|---|
| G05F 1/59 | (2006.01) |
| H03B 5/32 | (2006.01) |
| H03B 5/04 | (2006.01) |
| G05F 1/565 | (2006.01) |

(52) U.S. Cl.
CPC ................ *G05F 1/59* (2013.01); *G05F 1/565* (2013.01); *H03B 5/04* (2013.01); *H03B 5/32* (2013.01); *H03B 2200/006* (2013.01)

(58) Field of Classification Search
None
See application file for complete search history.

(56) References Cited

U.S. PATENT DOCUMENTS

| | | | | |
|---|---|---|---|---|
| 6,639,480 B2* | 10/2003 | Kubo | .............. | H03B 5/36 331/158 |
| 6,777,920 B2* | 8/2004 | Furutani | ............. | G05F 1/465 323/280 |
| 7,042,299 B2* | 5/2006 | Tachibana | ........... | H03B 5/364 331/116 FE |
| 7,088,196 B2* | 8/2006 | Ashida | ............ | H03K 3/012 331/116 FE |
| 7,276,984 B2* | 10/2007 | Hagino | ............. | H03K 3/011 327/535 |

FOREIGN PATENT DOCUMENTS

JP   H06-059756 A   3/1994

* cited by examiner

*Primary Examiner* — Jeffery S Zweizig
(74) *Attorney, Agent, or Firm* — Brinks Gilson & Lione

(57) ABSTRACT

Provided is a constant voltage output circuit having an output terminal and configured to supply power to a crystal oscillator circuit connected to the output terminal, the constant voltage output circuit, having: a bias current control circuit subjected to negative feedback control by an output voltage which is supplied from the output terminal. As a result, variation in the constant voltage output caused by variation in current from a constant current source is reduced.

3 Claims, 3 Drawing Sheets

CONSTANT VOLTAGE OUTPUT CIRCUIT

RELATED APPLICATIONS

This application claims priority under 35 U.S.C. § 119 to Japanese Patent Application No. 2017-059974 filed on Mar. 24, 2017, the entire content of which is hereby incorporated by reference.

BACKGROUND OF THE INVENTION

1. Field of the Invention

The present invention relates to a constant voltage output circuit.

2. Description of the Related Art

A crystal oscillator circuit for operation at low power consumption that is used in, for example, an electronic clock operates generally on an output voltage of a constant voltage output circuit in order to reduce current consumption. At the same time the difference between the operation start voltage of the crystal oscillator circuit and the output voltage of the constant voltage output circuit is set constant as described in Japanese Patent Application Laid-open H06-59756 to achieve a stable crystal oscillation operation without increasing power consumption of the crystal oscillator circuit. In this case, the output voltage of the constant voltage output circuit is determined by a voltage sum of a diode connection of a P-channel MOS (hereinafter abbreviated as "PMOS") transistor and an N-channel MOS (hereinafter abbreviated as "NMOS") transistor.

A bias current control circuit included in a related-art constant voltage output circuit is regarded as not being affected by variation in threshold values of transistors due to manufacturing process variation thereof. However, in a bias current control circuit illustrated in FIG. 4 a bias current value varies due to variation in resistor elements in the bias current control circuit. The bias current value varies due to the manufacturing process variation, and as a result, a value of the output voltage of the constant voltage output circuit varies due to effects other than the threshold values of the transistors.

SUMMARY OF THE INVENTION

The present invention has been made to provide a constant voltage output circuit suitable for a crystal oscillator circuit.

According to one embodiment of the present invention, there is provided a constant voltage output circuit having an output terminal and configured to supply power to a crystal oscillator circuit connected to the output terminal, the constant voltage output circuit, having: a bias current control circuit subjected to negative feedback control by an output voltage which the output terminal supplies.

According to the constant voltage output circuit of the present invention it is possible to reduce variation in the output voltage of the constant voltage output circuit. As a result, the crystal oscillator circuit and the constant voltage output circuit which operate at low power consumption can be obtained.

DETAILED DESCRIPTION OF THE EMBODIMENTS

Now, with reference to the drawings, description is made of a constant voltage output circuit of the present invention.

First Embodiment

Figure 1:
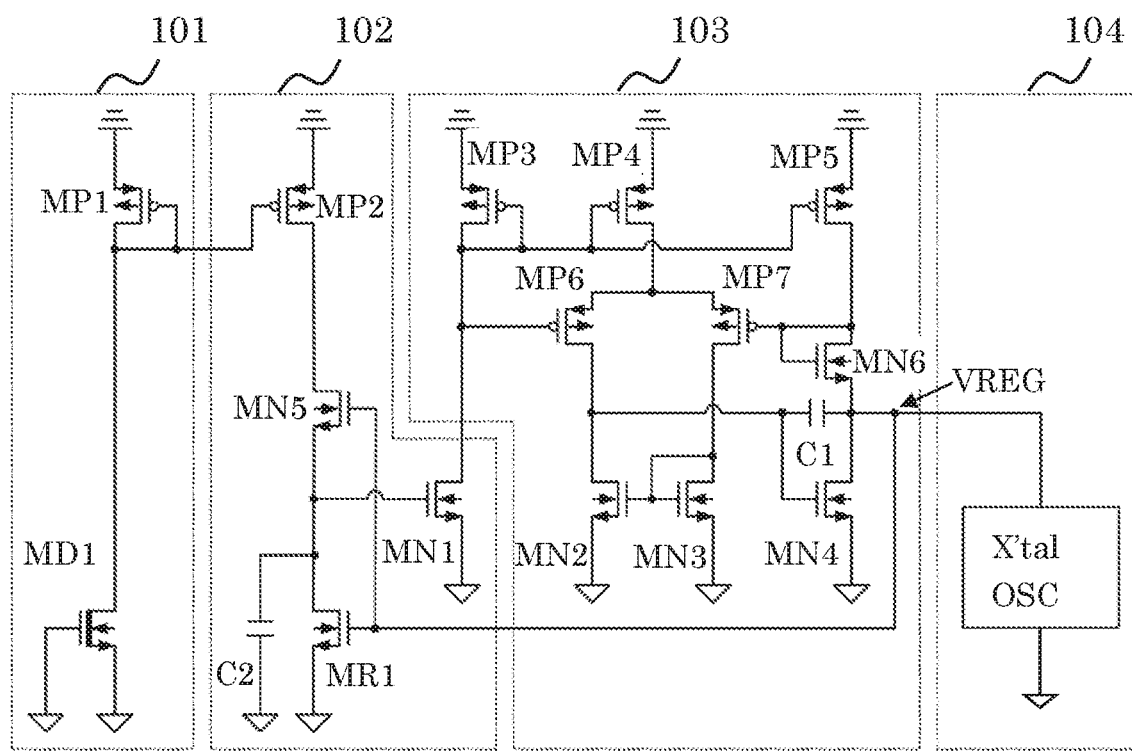
FIG. 1 is a circuit diagram for illustrating an example of a configuration of a constant voltage output circuit according to the present invention.

A constant voltage output circuit of a first embodiment of the present invention is illustrated in FIG. 1. The constant voltage output circuit of the first embodiment includes, as illustrated in FIG. 1, a constant current circuit 101, a bias current control circuit 102, and a constant voltage circuit 103. The constant current circuit 101 is formed of an N-channel depletion transistor MD1 and a PMOS transistor MP1. The bias current control circuit 102 is formed of a PMOS transistor MP2 and NMOS transistors MN1, MN5, and MR1. The constant voltage circuit 103 is formed of PMOS transistors MP3, MP4, MP5, MP6, and MP7 and NMOS transistors MN2, MN3, MN4, and MN6. An output node of the constant voltage circuit 103 is referred to as a VREG node, and a voltage between a power source and the VREG node is referred to as a voltage of the VREG node.

Connections in the constant current circuit 101 are described. A source terminal of the transistor MP1 is connected to a GND. A gate terminal and a drain terminal of the transistor MP1 are connected to a drain terminal of the transistor MD1 and a gate terminal of the transistor MP2. A gate terminal and a source terminal of the transistor MD1 are each connected to the power source.

Connections in the bias current control circuit 102 are described. A source terminal of the transistor MP2 is connected to the GND. A drain terminal of the transistor MP2 is connected to a drain terminal of the transistor MN5. A gate terminal of the transistor MN5 is connected to the VREG node. A source terminal of the transistor MN5 is connected to a gate terminal of the transistor MN1, a drain terminal of the transistor MR1, and one terminal of a capacitor C2. A gate terminal of the transistor MR1 is connected to the VREG node. The other terminal of the capacitor C2 and source terminals of the transistors MR1 and MN1 are each connected to the power source. A drain terminal of the transistor MN1 is connected to gate terminals of the transistors MP3, MP4, MP5, and MP6 and a drain terminal of the transistor MP3.

Connections in the constant voltage circuit 103 are described. Source terminals of the transistors MP3, MP4, and MP5 are each connected to the GND. A drain terminal of the transistor MP4 is connected to source terminals of the transistors MP6 and MP7. A drain terminal of the transistor MP6 is connected to a drain terminal of the transistor MN2, a gate terminal of the transistor MN4, and one terminal of a capacitor C1. A drain terminal of the transistor MP7 is connected to gate terminals of the transistors MN2 and MN3 and a drain terminal of the transistor MN3. A drain terminal of the transistor MP5 is connected to gate terminals of the transistors MN6 and MP7 and a drain terminal of the transistor MN6. Source terminals of the transistors MN2, MN3, and MN4 are each connected to the power source. A source terminal of the transistor MN6, a drain terminal of the transistor MN4, and the other terminal of the capacitor C1 are connected to the VREG node. The transistors MP6, MP7, MN2, and MN3 form a differential amplifier circuit.

In the constant current circuit 101, bias current is generated by the transistor MD1 being a constant current source. This current from the constant current source is replicated by a current mirror circuit formed of the PMOS transistors MP1 and MP2, and the replicated current flows as the bias current to the NMOS transistor MR1 which operates in a resistance region. The transistor MN5 is a transistor for causing the transistor MR1 to operate in a linear resistance region. The gate terminals of the transistors MN5 and MR1 are connected to the VREG node, and thus a resistance value of the transistor MR1 which operates in the resistance region varies depending on a voltage value of the VREG node. In general, a resistance value of a transistor that operates in a resistance region is represented by the following expressions.

$$R=1/(K*(Vgs-Vth))$$

$$K=\mu Cox(W/L)$$

In those expressions, μ is a mobility of electrons in a semiconductor, Cox is a gate capacitance per unit area of a MOS transistor, W is a channel width, L is a channel length, and Vth is a threshold value of the transistor. Further, in those expressions, Vgs is the voltage of the VREG node (voltage between power source and VREG node), and a resistance R is a function of the voltage of the VREG node. Accordingly, when the voltage of the VREG node increases, the resistance value of the transistor MR1 decreases, and when the voltage of the VREG node decreases, the resistance value of the transistor MR1 increases. Further, the gate terminal of the transistor MN1 is connected to the drain terminal of the transistor MR1, and thus, in the bias current control circuit, a gate voltage of the transistor MN1 is determined by a product of a current generated by the transistor MD1 and the resistance value of the transistor MR1. As a result, a current value of the transistor MN1 is determined.

Now, a case in which the current that is generated by the transistor MD1 decreases due to manufacturing process variation of the transistor MD1 is described. The voltage of the VREG node is a sum of the transistors MP3 and the diode voltages of MN6. When the bias current decreases, an absolute value of the voltage of the VREG node drops. Meanwhile, according to the above-mentioned expressions, the resistance value of the transistor MR1 increases when the absolute value of the voltage of the VREG node drops. Consequently, the product of the current generated by the transistor MD1 and the resistance value of the transistor MR1 is constant, and hence the gate voltage of the transistor MN1 does not depend on the current generated by the transistor MD1. In short, through use of the bias current control circuit, the voltage of the VREG node is not affected by variation in the transistor MD1 being the constant current source. In addition, when the current that is generated by the transistor MD1 increases due to the manufacturing process variation, the voltage of the VREG node and the resistance value of the transistor MR1 merely behave reversely from those described above, and negative feedback control is performed so that the gate voltage of the transistor MN1 is kept constant.

In this circuit configuration, the bias current is subjected to the negative feedback control by the voltage of the VREG node, and hence the capacitor C2 functions as a capacitor for phase compensation.

Second Embodiment

Figure 2:
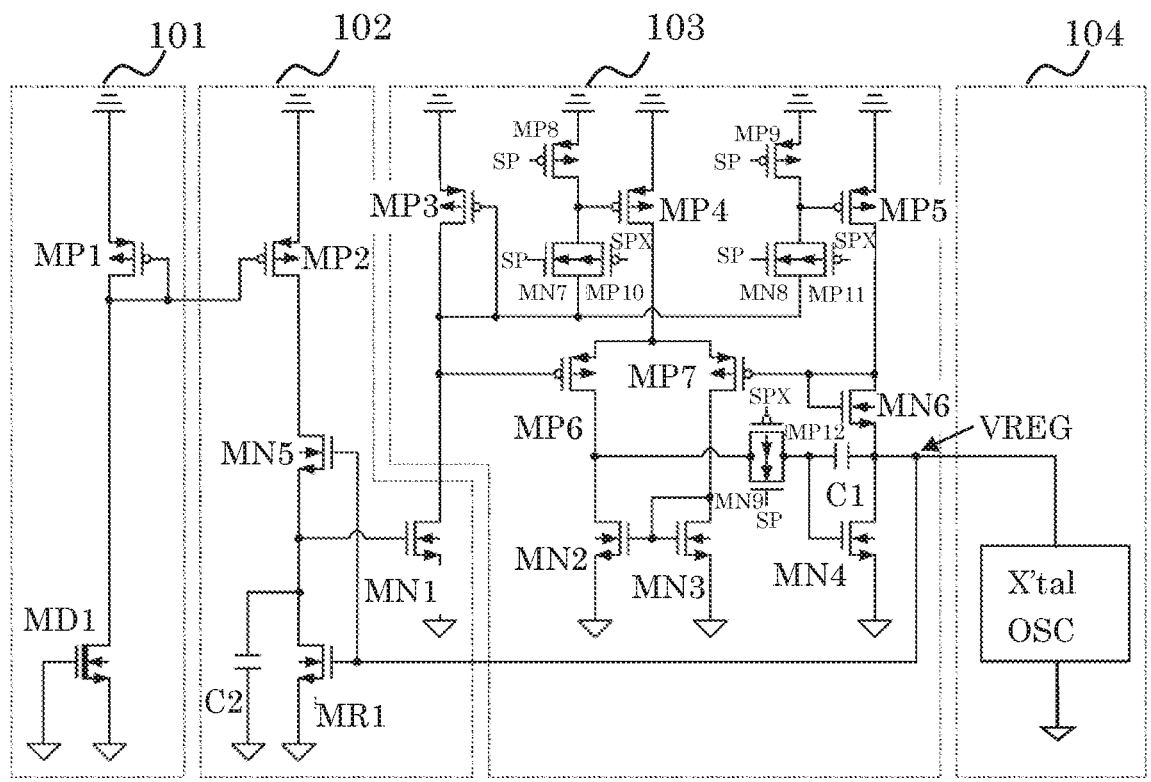
FIG. 2 is a circuit diagram for illustrating another example of the configuration of the constant voltage output circuit according to the present invention.
Figure 3:
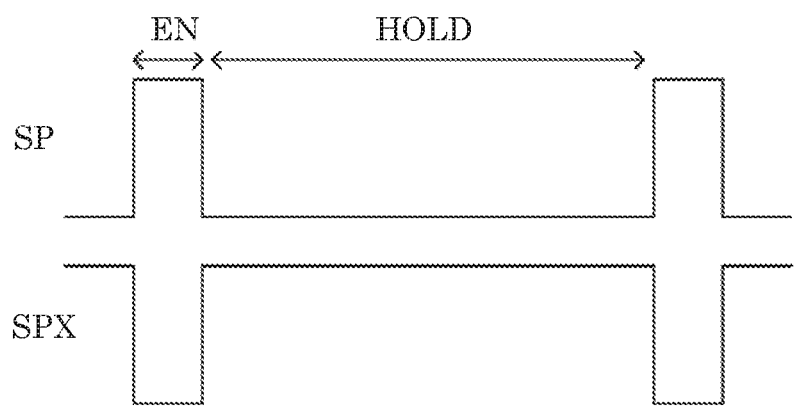
FIG. 3 is a graph for showing an example of a timing of sample-and-hold signals output from a sample-and-hold signal generation circuit according to the present invention.
Figure 4:
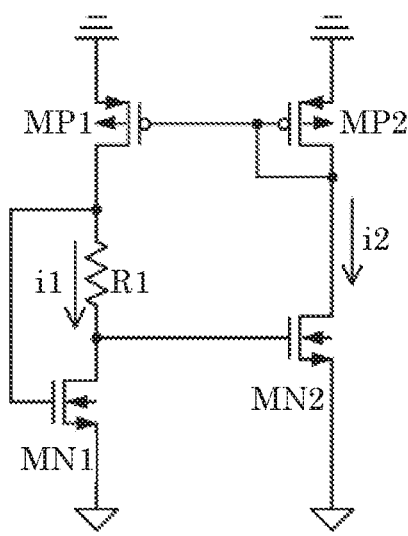
FIG. 4 is a circuit diagram for illustrating an example of a configuration of a bias current control circuit in a related-art constant voltage output circuit.

A constant voltage output circuit of a second embodiment of the present invention is illustrated in FIG. 2. With this circuit configuration, power consumption of the constant voltage output circuit itself is reduced. In the second embodiment, there are provided a switch configured to perform a sample-and-hold operation, a sample-and-hold signal generation circuit configured to generate signals for causing the switch to perform the sample-and-hold operation, and a holding circuit. Sample-and-hold signals shown in FIG. 3 are generated to be applied to the switch, and the operation of the constant voltage circuit is stopped to maintain the sample-and-hold signals in an enable state, to thereby reduce the power consumption.

Now, differences of the configuration of the constant voltage output circuit of the second embodiment from that of the first embodiment are described. As illustrated in FIG. 2, the constant current circuit 101 and the bias current control circuit 102 are the same as those of the first embodiment.

Differences of the configuration of the constant voltage circuit 103 from that of the first embodiment are described. The gate terminal of the transistor MP4 is connected to the GND via a transistor MP8, and transistors MN7 and MP10 are connected in parallel to the gate terminal and the drain terminal of the transistor MP3. The gate terminal of the transistor MP5 is connected to the GND via a transistor MP9, and transistors MN8 and MP11 are connected in parallel to the gate terminal and the drain terminal of the transistor MP3. Transistors MP12 and MN9 are connected in parallel between the gate terminal of the transistor MN4 and the one terminal of the capacitor C1, and the drain terminals of the transistors MP6 and MN2. A sample-and-hold signal having a waveform SP shown in FIG. 3 is applied to the gate terminals of the transistors MP8, MP9, MN7, MN8, and MN9. A sample-and-hold signal having a waveform of SPX shown in FIG. 3 is applied to the gate terminals of the transistors MP10, MP11, and MP12.

The sample-and-hold operation is described in detail. When the sample-and-hold signals SP and SPX shown in FIG. 3 are in an enable state, the sample-and-hold signal SP is at a high level, and the sample-and-hold signal SPX is at a low level. In the constant voltage circuit 103, the transistor MP4 forms a constant current circuit by means of a current mirror circuit. The transistors MN7 and MP10 are turned on, and the transistor MP8 is turned off. The transistors MP4 and MP3 form the current mirror circuit. A current determined by the transistor MP3 flows through the transistor MP4.

Similarly, the transistor MP5 forms a constant current circuit by means of a current mirror circuit. The transistors MN8 and MP11 are turned on, and the transistor MP9 is turned off. The transistors MP5 and MP3 form the current mirror circuit. A current determined by the transistor MP3 flows through the transistor MP5.

The transistors MN9 and MP12 are turned on, and the gate terminal of the transistor MN4 and the one terminal of the capacitor C1 are connected to the drain terminals of the transistors MP6 and MN2.

When the sample-and-hold signals SP and SPX shown in FIG. 3 are in a hold state, the sample-and-hold signal SP is at a low level, and the sample-and-hold signal SPX is at a high level. The transistors MN7 and MP10 are turned off, and the transistor MP8 is turned on. An OFF signal is applied to the gate terminal of the transistor MP4 via the transistor MP8, and thus the current that flows through the transistor MP4 is stopped.

Similarly, the transistors MN8 and MP11 are turned off, and the transistor MP9 is turned on. An OFF signal is applied to the gate terminal of the transistor MP5 via the transistor MP9, and thus the current that flows through the transistor MP5 is stopped. With this configuration, current consumption of the constant voltage circuit itself can be reduced. Further, the transistors MN9 and MP12 are turned off, and thus the gate terminal of the transistor MN4 and the differential amplifier circuit section are separated from each other. As a result, the gate terminal of the transistor MN4 is not affected by the separated differential amplifier circuit section. The voltage of the gate terminal of the transistor MN4 is kept at a voltage at the time when the sample-and-hold signals are in the enable state by the capacitor C1 for phase compensation, and thus a current having the same magnitude as that of the current at the time of the enable state flows through the transistor MN4. The capacitor C1 operates as a holding circuit configured to hold the voltage of the gate terminal of the transistor MN4. As long as a load of a target circuit does not greatly change, the same constant voltage output as that at the time of the enable state can also be obtained in the hold state.

As described above, according to the second embodiment, the switch configured to perform the sample-and-hold operation stops the operation of the constant voltage circuit arbitrary to maintain the state at the time of the enable state. As a result, the power consumption of the constant voltage output circuit itself can be reduced, and variations in the output voltage can be reduced. Further, as the variation in the output voltage can be reduced, the output voltage can be brought close to a stop voltage of the target circuit to be supplied with electric power. As a result, power consumption of the target circuit can also be reduced.

Further, the capacitor C1 for phase compensation forms the capacitor configured to hold the voltage of the gate terminal of the transistor MN4 at the time of the hold state. The capacitor for phase compensation that is generally used in the constant voltage output circuit is used as it is, and thus the number of components can be reduced.

What is claimed is:

1. A constant voltage output circuit having an output terminal and configured to supply power to a crystal oscillator circuit connected to the output terminal, the constant voltage output circuit, comprising:
    a constant current circuit;
    a bias current control circuit subjected to negative feedback control by an output voltage which is supplied from the output terminal; and
    a constant voltage circuit,
    the bias current control circuit including a first transistor, a second transistor, and a third transistor,
    a drain terminal of the first transistor being supplied with a current determined by the constant current circuit, a control terminal of the first transistor being connected to a control terminal of the second transistor and the output terminal of the constant voltage output circuit, and a source terminal of the first transistor being connected to a drain terminal of the second transistor,
    a source terminal of the second transistor being connected to a power supply terminal, and
    a drain terminal of the third transistor being connected to the constant voltage circuit, a source terminal of the third transistor being connected to the power supply terminal.

2. A constant voltage output circuit according to claim 1, further comprising:
    a switch configured to stop operation of the constant voltage circuit;
    a holding circuit configured to hold the output voltage; and
    a control signal generation circuit configured to control the switch.

3. A constant voltage output circuit having an output terminal and configured to supply power to a crystal oscillator circuit connected to the output terminal, the constant voltage output circuit, comprising:
    a bias current control circuit subjected to negative feedback control by an output voltage which is supplied from the output terminal;
    a constant voltage circuit;
    a switch configured to stop operation of the constant voltage circuit;
    a holding circuit configured to hold the output voltage; and
    a control signal generation circuit configured to control the switch.

* * * * *